United States Patent [19]

Paranjpe

[11] Patent Number: 5,434,107
[45] Date of Patent: Jul. 18, 1995

[54] METHOD FOR PLANARIZATION

[75] Inventor: Ajit P. Paranjpe, Plano, Tex.

[73] Assignee: Texas Instruments Incorporated, Dallas, Tex.

[21] Appl. No.: 188,498

[22] Filed: Jan. 28, 1994

[51] Int. Cl.⁶ .......................................... H01L 21/463
[52] U.S. Cl. ................... 437/225; 437/235; 437/228; 264/272.17
[58] Field of Search ............... 437/249, 250, 228, 236, 437/238, 225; 264/323, 175, 272.17; 425/420, 405.1, 44; 156/635

[56] References Cited

U.S. PATENT DOCUMENTS

| | | | |
|---|---|---|---|
| 4,894,706 | 1/1990 | Sato et al. | 357/72 |
| 5,073,518 | 12/1991 | Doan et al. | 437/180 |
| 5,302,233 | 4/1994 | Kim et al. | 437/228 |
| 5,308,792 | 5/1994 | Okabayashi et al. | 437/180 |
| 5,326,243 | 7/1994 | Fierkens | 264/272.17 |
| 5,348,615 | 9/1994 | Gupta | 437/228 |

FOREIGN PATENT DOCUMENTS 2212332 7/1989 United Kingdom ........... 264/272.17

Primary Examiner—Brian E. Hearn
Assistant Examiner—Tuan Nguyen
Attorney, Agent, or Firm—John D. Crane; Richard L. Donaldson; James C. Kesterson

[57] ABSTRACT

A method for planarization of the upper surface of a semiconductor wafer. A wafer with features formed thereon is loaded into the apparatus after having been coated with an interlevel dielectric. Thereafter, the wafer is subjected to suitably elevated temperature while a uniform elevated pressure is applied. Once the temperature and pressure conditions exceed the yield stress of the film, the film will flow and fill the microscopic as well as global depressions in the wafer surface. Thereafter, the temperature and pressure is reduced so that the film will become firm again thereby leaving a planar upper surface on the wafer.

21 Claims, 3 Drawing Sheets

METHOD FOR PLANARIZATION

FIELD OF THE INVENTION

This invention relates generally to the field of planarizing semiconductor wafers and specifically to the field of planarizing the surface of a wafer to produce a flat surface on which interconnect wiring can be formed.

BACKGROUND OF THE INVENTION

The advent of multi-level metallization in ULSI circuits has placed stringent requirements on the planarity of the surface prior to metallization. Indeed, without some form of planarization between intervening layers of metallization, the topography of the lower layers is to some extent reflected in the topography of the insulating layer which forms the surface on which each additional level of metallization is formed. This is undesirable because it adds to the processing steps required, increases process complexity, and can lead to reduced device reliability.

There are two types of planarization which must be achieved; local and global. In local planarization, spaces between closely packed features are filled with an interlevel dielectric. Ideally, the dielectric provides void free filling and a locally planarized surface. In reality, however, the surface of the filled areas still reflect some of the underlying topography. When the wafer is covered by an interlevel dielectric layer whose exposed surface is flat, global planarization is achieved. Because the requirements of these two types of planarization are so different, separate processes are employed. Usually, local planarization is performed first followed by global planarization.

A number of local planarization processes are known and have proved successful. One such process involves atmospheric pressure chemical vapor deposition (APCVD) and sub-atmospheric chemical vapor deposition (SACVD) of TEOS and $O_3$. These processes provide void-free filling of submicron spaces, with a relatively planar TEOS oxide film but global planarization cannot be achieved. The films provide good electrical characteristics in that the film has a high breakdown strength, is free of pin holes and has a low dielectric constant. This film becomes a part of the device structure.

Local planarization, though somewhat defective, can also be achieved with electron cyclotron resonance (ECR) deposited oxide films, however, the upper surface topology mirrors that of the underlying features. Other problems with this approach include safety concerns about high bias voltages that are used during deposition and unacceptable defect frequency. The films produced, however, have good electrical properties and become part of the device structure.

A third approach for local planarization involves low pressure chemical vapor deposition (LPCVD) or plasma enhanced chemical vapor deposition (PECVD) TEOS oxide followed by deposition and reflow of boro phospho silicate glass (BPSG). This process is suitable for local planarization but it has not proved to be suitable for complete global planarization.

A fourth approach involves conventional sputter deposition of aluminum which produces planar films that form the interconnect. Step coverage of the film in contacts/vias, however, is poor thereby leading to incomplete filling. For this reason, CVD tungsten, which has good gap filling properties due to its highly conformal nature, is used to fill the contacts/vias, while aluminum is used to form the interconnect. However, this process sequence is complicated, and a single aluminum deposition to form the contact/via plugs and the interconnect is preferred. Recently, aluminum reflow that employs high temperature aluminum deposition to improve the step coverage has been demonstrated for void-free contact/via filling. However, this method is sensitive to the surface state of the wafer and does not reliably fill contacts/vias.

Local planarization is often followed by one of the global planarization techniques. One of the most common approaches involves coating the surface with a sacrificial dielectric followed by an etchback. This includes schemes such as SOG etchback and resist etchback, in which the wafer is coated with the dielectric. Because of the low surface tension of the dielectric during the coating process, the dielectric tends to flow into lower areas on the wafer which, on curing, forms a film that reduces the severity of the underlying topography. This reduced severity of topography is then transferred into the underlying dielectric (usually an oxide) via an etchback in which the sacrificial dielectric is removed. By repeating this cycle several times, a planarized surface is obtained. The biggest disadvantage of this process, however, is the multiple coating and etchback cycles required to obtain acceptable planarization. Often more than four cycles are required for adequate planarization.

To reduce the number of cycles required, blocking masks can be used, in which the sacrificial dielectric is coated and then patterned so that it fills up the dips in the topography. Another coat of the sacrificial dielectric is then applied to produce a planarized surface. This planar topography is transferred to the underlying interlevel dielectric via an etchback.

Another global planarizing approach that has gained some popularity is known as chemical mechanical polishing. In this technique, a polishing pad is used with a reactive slurry to polish the wafer surface until the surface is planarized. This technique, however, suffers from several limitations. The polishing rates are a function of many variables including feature size, aspect ratio, feature density and material type. Polishing rates also vary across the wafer and depend on the quality of the polishing pad. Post-process wafer clean-up is also an area of concern. When carefully applied, however, this technique has proved successful.

There are other approaches which are still in the experimental stage and involve new spin on or deposited dielectrics that provide good gap filling, electrical and thermal properties, and also provide global planarization. Examples of these materials include various types of fluorinated polymers, polyimides and siloxanes. All these approaches increase the planarization scale lengths appreciable ($>100$ $\mu$m), but still do not provide true global planarization.

BRIEF DESCRIPTION

The present invention seeks to overcome the above outlined problems related to planarization of the upper surface of a wafer. The first step of the method involves using well developed techniques to achieve high quality filling of submicron spaces with an interlevel dielectric which results in producing a locally planarized surface. In some instances, a second film of interlevel dielectric may be deposited on the wafer to produce the desired interlevel thickness and improve global planarity. Thereafter, the wafer is coated with a film made of a deformable material such as a metal or a dielectric. This film is mechanically deformed during a controlled cure by applying a uniform pressure to the film to cause the film to flow into both small as well as large depressions in the upper surface of the wafer and to cause the upper surface of the film to become ultra-flat. After curing, the deformable film has a flat surface on which other layers such as a layer of metalization or any other structure can be formed.

DETAILED DESCRIPTION

Figure 1:
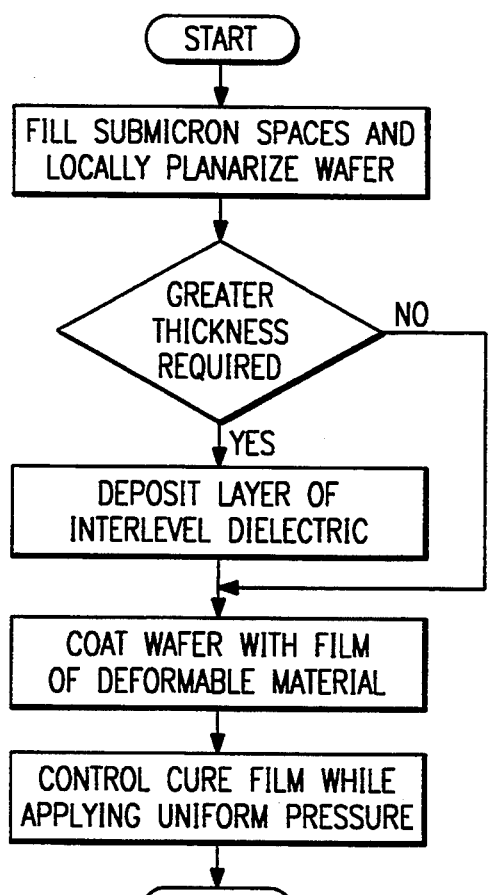
FIG. 1 is a brief flow chart illustrating the planarization method of this invention.

A brief flow chart of the method of the present invention is shown in FIG. 1. The process begins with the filling of submicron spaces with an interlevel dielectric typically comprising an oxide such as $TEOS/O_3$ although other dielectric materials useful for filling submicron spaces can be used as well such as high density plasma deposited oxides. The oxide is deposited using any suitable depositing method such as atmospheric or sub-atmospheric chemical vapor deposition (CVD). This will result in filling the submicron spaces in the structure resulting in an upper surface which is locally planarized. In some instances, a second dielectric deposition process may be required to produce the desired dielectric thickness and to improve the global planarity. As the coating will frequently have a topography which mirrors the underlying structure, an etch back step may also be utilized to minimize the mirroring of underlying structure. The etch back and coating process may be repeated. The desired surface after these steps is preferably one with an aspect ratio (the ratio of the step height to the lateral width of a feature) of less than 1.5:1.

The dielectric used for local planarization should have good properties, such as having high breakdown strength, low dielectric constant, freedom from pinholes, etc, as the dielectric will become part of the final device structure.

Once the dielectric has reached the desired thickness and local planarization achieved, the global planarization is started. During global planarization, the wafer is first coated with a film of a deformable material such as low melting point metals or alloys, spun on glass(SOG), a suitable resin or even a reflowable glass. All of the mentioned and other useful materials for the deformable film have a characteristic, usually occurring at elevated temperatures, wherein the material is deformable under pressure.

Once the uncured deformable film is applied to the wafer, it is maintained at a temperature, usually above typical room temperature, at which deformation is possible. The deformable film is then deformed by squeezing the film coated wafer between two ultra-parallel, ultra-flat and temperature controlled bodies. In this context, an ultra-flat surface is one where the maximum height variation about a mean height is in the order of about 250 A. Ultra-parallel implies that the two bodies between which the wafer is squeezed have surfaces which are separated by a distance which varies not more than about 250 A about the mean separation distance. When the stress in the deformable film exceeds its yield stress, the film will deform to conform to the shape of the plate in contact therewith the deformable film. In practice, a pressure of up to about 2 MPa is applied during the squeezing operation, although higher pressure may be required to deform some materials.

The temperature of the bodies may be controlled to achieve a controlled curing of the deformable film. Typically, the temperature of the bodies will be quickly raised at the beginning of the squeezing operation. In the case where the deformable film cures chemically, the curing can usually be accelerated by raising the temperature. This will speed the cycle time for the manufacturing process. For materials such as glass, they become deformable at elevated temperature under the applied pressure. When the material becomes deformable, however, the pressure may be reduced because if the rate of deformation is too great, the deformable film may crack. Also, reduced pressure may be needed to prevent squeezing most of the deformable film out from contact with one of the plates. Once the deformable film has cured, the temperature of the plates can be lowered so that the wafer can be removed and a new wafer can be loaded into the squeezing apparatus.

In some cases, multiple squeeze and release cycles may be required to produce the desired conformity of the film coated surface of the wafer to the surface of the body squeezed against the film. In addition, on completion of the squeezing step(s), in some cases an etch may be desired to reduce the thickness of the film to a desired thickness.

Figure 2:
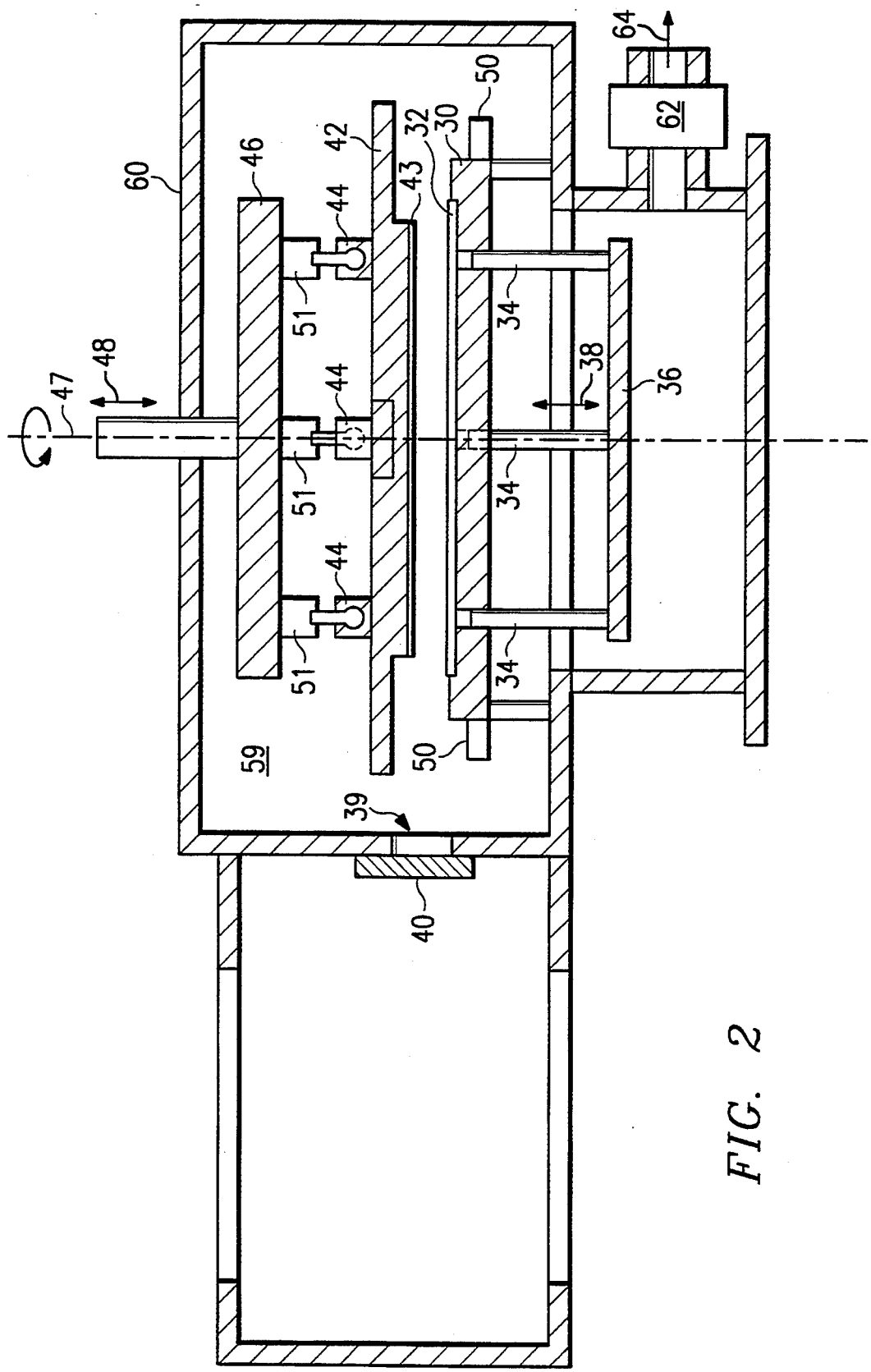
FIG. 2 is a schematic diagram of an apparatus used in the method of this invention for applying uniform pressure to a deformable film being planarized on the surface of a wafer.

FIG. 2 illustrates an apparatus for squeezing a wafer during the curing of a deformable film. The squeezing apparatus is located in a closed chamber 59 and includes a temperature controlled chuck 30 having an ultra-flat upper surface on which a wafer 32 rests. The chuck 30 has three vertical holes positioned to permit three load-/unload fingers 34 to pass therethrough when desired. The fingers 34 are attached to a plate 36 which may be raised or lowered by any suitable mechanism in the direction of the double headed arrow 38. When the fingers 34 are in their lowered position as illustrated in FIG. 2, the wafer 32 will rest on the upper surface of the chuck 30. However, when the plate 36 is raised (not illustrated), all the fingers 34 extend through the upper surface of the chuck 30 and support the wafer 32 from below at a position above the upper surface of the chuck 30. While the wafer 32 is so supported by the fingers 34, a wafer moving arm (not shown) can project through the opening 39 in the chamber 59, which is normally covered by the door 40 illustrated in its closed position, and lift the wafer 32 off the fingers 34. In a similar fashion, a wafer can be loaded into the assembly of FIG. 2.

The apparatus of FIG. 2 includes a temperature controlled plate 42 having an ultra-flat lower surface disposed parallel to the chuck 30. The plate 42 is preferably coated with a non-stick material 43 such as a fluropolymer, e.g. teflon, which prevents the deformable film formed on the upper surface of the wafer 32 from being separated from the wafer when pressure from the plate 42 is withdrawn. The plate 42 has three gimbal mounts 44 attached to the upper surface thereof. The gimbal mounts 44 are coupled to piezoelectric actuators 51 which are mounted on the lower surface of a plate 46 which may be rotated around the axis 47 or raised and lowered in the direction of double headed arrow 48. The gap between the plate 42 and the chuck 30 is monitored by three position sensors 50 (two of which are shown). The plate 42 in operation is lowered toward the chuck 30. When the plate 42 is a desired distance above the chuck 30, the sensors 50 actuate the piezoelectric actuators 51 coupled thereto to adjust the squeezing pressure applied to the wafer 32 to a desired pressure.

While the preferred embodiment of the invention is to have a flat plate 42 come in contact with the deformable film on a wafer so as to produce a flat surface on the film, the above described apparatus may be utilized to produce a surface which is not flat. This is accomplished by having a desired surface topography formed on the lower surface of the plate 42. The plate 42 is then rotationally positioned by rotation about the axis 47 and lowered into pressure engagement with the film coated wafer. When this plate is pressed into the uncured deformable film on top of the wafer, the upper surface of the film will conform to the topography of the lower surface of the plate 42.

Both the chuck 30 and the plate 42 are temperature controlled using conventional temperature control techniques. Both the chuck 30 and plate 42 may have resistive heating elements imbedded therein with external connections to a temperature control circuit for applying controlled electrical power to the heating elements so that chuck 30 and the plate 42 can be heated to a selected elevated temperature. In the alternative, both the chuck 30 and the plate 42 can be heated by a heated fluid which is pumped through fluid passages therein (not illustrated). Indeed, the chuck 30 and the plate 42 can be temperature controlled by both resistive heating elements and by heated fluid being pumped through passages therein. Other controlled heating methods and apparatus can be employed so long as a selectable temperature sufficiently high to cause the film to deform under pressure can be maintained.

The apparatus described above consists of an assembly disposed inside a closed chamber 59 largely defined by exterior walls 60. The door 40, illustrated in its closed position, provides access, when opened, to the closed chamber 59 through opening 39. A throttle valve 62, which controls the air pressure inside the chamber 59, is disposed between the chamber 59 defined by the walls 60 and a vacuum pump (not shown) which draws air out of the chamber 59 in the direction of arrow 64. This allows the equipment operator to select the desired pressure within the chamber 59 for curing of the deformable film in an ambient which is sub-atmospheric. Conversely, if it were deemed desirable to perform the curing of the film at pressures above atmospheric pressure, a pressure source could be coupled to the throttle valve 62 to admit a gas into the chamber 59 at a desired pressure.

EXAMPLE

Once the surface of the wafer has been locally planarized, a film of a deformable material, such as spun on glass (SOG) or a deformable metal, is deposited on the wafer. The film material can be deposited on a wafer by various methods, for example, by dripping the film material onto the wafer in a liquid state while the wafer is being spun. The material will quickly flow over the surface of the wafer. In the case of deformable metal films, they may be deposited via sputtering or CVD and typically are selected from the group comprising aluminum, tin or other low melting point metals. At this point, the wafer is ready for the curing process during which the film is flattened.

During the curing of the film, the wafer is placed in an apparatus of the type illustrated in FIG. 2. By squeezing the wafer with a film thereon between the plate 42 and the chuck 30, the film is deformed so as to conform to the shape of the plate 42 which is flat. The film is also forced into gaps or voids within the surface of the device being coated thereby achieving local planarization as well. During this squeezing process for a film such as spun on glass, the pressure maintained during curing is in the order of 1–10 MPa. For other dielectrics and for metal films, the pressure maintained during curing will most likely be different from that used for spun on glass and the best pressure must be determined by experimentation. Once the film is cured, the upper surface thereof will be flat as it has conformed to the shape of the plate 42 during the curing.

The curing of the film is affected by temperature. Hence, the chuck 30 and the plate 42, in the preferred embodiment of the apparatus, are temperature controlled. During the curing of a film made of BPSG, for example, the temperature of the chuck 30 and the plate 42 will be elevated to about 700 degrees Celsius and will be maintained at that temperature for about two (2) minutes. This elevated temperature is most easily achieved by passing a controlled current through a resistive heating element buried in the chuck 30 and the plate 42 although other approaches for heating the chuck 30 and plate 42 may also be utilized. The temperature is thereafter lowered using a liquid coolant which is forced through cooling passages in both the chuck 30 and the plate 42. The liquid coolant is utilized to rapidly cool the chuck 30 and plate 42, however, if a slower or different cooling rate is desired, other cooling methods can be used such as radiant cooling, controlled reduction of current through the resistive heating element, or any other method for achieving the desired cooling rate.

Figure 3:
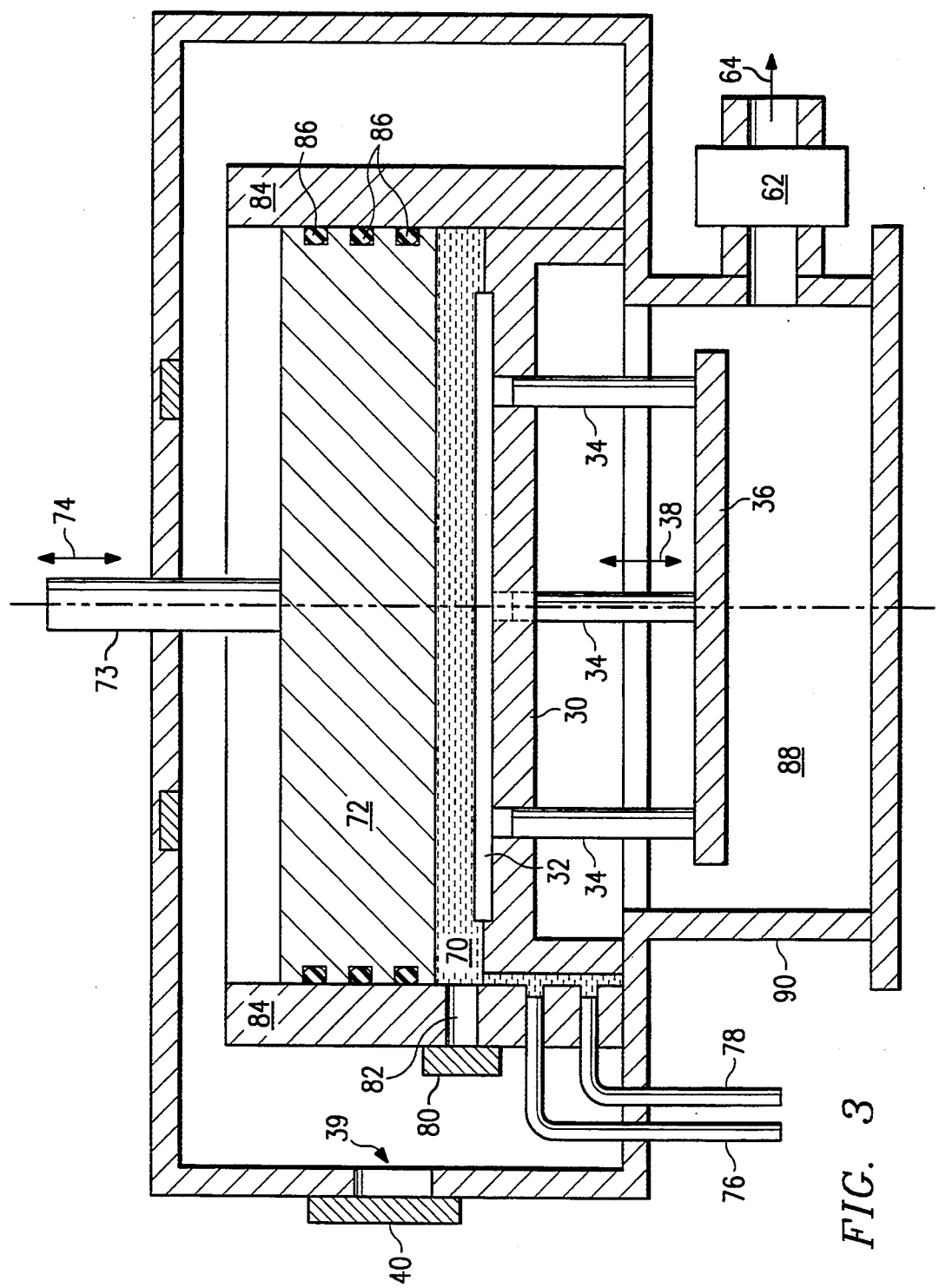
FIG. 3 is a schematic diagram of an alternative apparatus used in the method of this invention for applying uniform pressure to a deformable film being planarized on the surface of a wafer.

Referring now to FIG. 3, an alternative embodiment of the apparatus of FIG. 2 is shown. In this drawing, the elements of FIG. 2 which are the same as in FIG. 2 have the same lead line designations in FIG. 3 as in FIG. 2. The principal difference between the apparatus of FIG. 2 and that of FIG. 3 is that in FIG. 2, uniform pressure on the film is provided by the plate 42 being forced into contact with the film on the wafer surface while in FIG. 3, a fluid 70 under high pressure is disposed between plate 72 and the wafer 32 to apply uniform pressure on the film on the wafer 32.

The apparatus of FIG. 3 includes a pressure plate 72 which is movable up and down in the direction indicated by double headed arrow 74. The plate 72 is illustrated schematically in FIG. 3 and comprises a disc shaped body as viewed from above. Plate 72 acts like a piston and is forced downwardly by a motor or other suitable force generating apparatus (not shown) coupled to shaft 73. Downward movement of the plate 72 pressurizes the fluid 70 disposed between the plate 72 and the wafer 32. This will planarize the deformable film and also fill gaps and voids. As with the apparatus of FIG. 2, the wafer 32 is maintained at a suitable curing temperature by maintaining the plate 30, plate 72 and the fluid 70 at a suitable curing temperature. The pressure of the fluid 70 on the upper surface of the coated wafer 32 is maintained during curing in the range described with respect to the apparatus of FIG. 2.

The fluid 70 may be either a liquid, a gas or a super critical fluid. A super critical fluid has properties like a gas at low pressure and properties somewhat between a gas and a liquid at high pressure. The fluid 70 is introduced and withdrawn from the cavity between the plate 30 and plate 72 by schematically illustrated conduits 76 and 78. The valve 62 and the attached pump 64 serves to evacuate any of the fluid 70 from the apparatus at times when a wafer is being either loaded or unloaded or in the event removal by the conduits 76 and 78 is not as complete as desired.

The apparatus of FIG. 3 includes a door 80 which seals the opening 82 in the vertical wall 84 which encircles the plates 72 and 30 thereby forming the closed chamber in which the wafer 32 can be subjected to the pressurized fluid 70. Suitable pressure sealing rings 86 are disposed between the plate 72 and the wall 84 to prevent the fluid 70, when under pressure, from escaping from the chamber formed between the wall 84 and plates 30 and 72. Suitable additional sealing rings may be required between the plate 30 and the wall 84 if it is desired not to fill the chamber 88 located below the plate 30 and the exterior wall 90 of the apparatus. In this alternative, seals may also be required between the posts 34 and the plate 30.

The wafer 32 is loaded and unloaded from the apparatus of FIG. 3 in a manner similar to that of FIG. 2. The atmosphere within the apparatus is first adjusted to that of the environment outside door 40. Then both door 40 and door 80 are opened. The posts 34 are raised to lift the wafer 32 above the plate 30 and an external arm (not shown) enters the chamber and lifts the wafer 32 off the posts 34. Thereafter, the wafer 32 is withdrawn and another introduced for planarization.

While the above description has been directed to the embodiments of the present invention as illustrated in the Figures, those of ordinary skill in the art will recognize that the specific illustrated embodiment may be modified in many ways as outlined above and in other ways as well without departing from the spirit and scope of the present invention as defined by the following claims.

What is claimed is:

1. A method for both global and local planarization of a surface of a semiconductor wafer having features formed thereon, the method comprising the steps of:
   a. filling the spaces between said features with an interlevel dielectric material to form a locally planarized surface;
   b. coating the wafer with a deformable film; and
   c. forcing a substantially planar plate in a direction normal to and onto the surface of the wafer coated with said deformable film to compress said deformable film during curing thereof with a selected force to produce a substantially planar surface when said film has cured.

2. The method of claim 1 wherein said interlevel dielectric is a material for filling submicron spaces between features formed on said wafer.

3. The method of claim 1 wherein said deformable film is made of a material which deforms at an elevated temperature and pressure.

4. The method of claim 1 additionally including the step of maintaining said deformable film at a temperature at which said deformable film can be deformed under pressure.

5. The method of claim 1 wherein said deformable film is made of a metal which deforms at an elevated temperature and pressure.

6. The method of claim 5 wherein said metal is selected from a group of metals comprising tin and aluminum.

7. A method for global and local planarization of the surface of a semiconductor wafer, the method comprising the steps of:
   a. coating said wafer with a deformable film;
   b. controlling the temperature of two bodies having substantially planar and parallel surfaces;
   c. disposing said wafer between and parallel to said parallel surfaces; and
   d. moving one said body toward said other body until said wafer is squeezed between said two bodies with a sufficient pressure to compress and deform said film to produce a globally planarized surface of said wafer.

8. The method of claim 7 additionally including the step of continuing to squeeze said wafer until said deformable film has cured.

9. The method of claim 7 wherein said controlling step includes elevating the temperature of said deformable film prior to curing thereof and reducing the temperature once said deformable film is cured.

10. The method of claim 7 wherein said filling step results in an aspect ratio of features on the wafer of no greater than about 1.5/1.

11. The method of claim 7 wherein said deformable film comprises a material selected from the group consisting of spun on glass, low melting point metals, low melting point alloys, resins and reflowable glass.

12. A method for global and local planarization of the surface of a semiconductor wafer having features formed thereon, the method comprising the steps:
   a. filling the spaces between said features with an interlevel dielectric material to form a locally planarized surface;
   b. coating the wafer with a film which is deformable during curing thereof;
   c. supporting the coated wafer on a substantially planar temperature controlled chuck; and
   d. forcing a substantially planar temperature controlled plate in a direction normal to and onto the surface of the wafer coated with said film during curing thereof with a selected force to produce a substantially planar surface when said film has cured.

13. The method of claim 12 wherein the aspect ratio of features on said wafer after said filling step is no greater than about 1.5/1.

14. The method of claim 12 wherein said interlevel dielectric is a material for filling submicron spaces between features formed on said wafer.

15. The method of claim 12 wherein said deformable film is made of a material which deforms at an elevated temperature and pressure.

16. The method of claim 12 additionally including the step of maintaining said deformable film at a temperature at which said deformable film can be deformed under pressure.

17. A method for planarization of the surface of a semiconductor wafer having features formed thereon, the method comprising the steps:
   a. filling the spaces between said features with an interlevel dielectric material;

b. coating the wafer with a film which is deformable during curing thereof;

c. supporting the coated wafer on a substantially planar temperature controlled chuck; and d. applying a substantially uniform fluid pressure to the surface of the wafer coated with said film during curing thereof with a selected force to produce a substantially planar surface when said film has cured.

18. The method of claim 17 wherein the aspect ratio of features on said wafer after said filling step is no greater than about 1.5/1.

19. The method of claim 17 wherein said interlevel dielectric is a material for filling submicron spaces between features formed on said wafer.

20. The method of claim 17 wherein said deformable film is made of a material which deforms at an elevated temperature and pressure.

21. The method of claim 17 additionally including the step of maintaining said deformable film at a temperature at which said deformable film can be deformed under pressure.

* * * * *